United States Patent
Im et al.

(10) Patent No.: US 8,056,698 B2
(45) Date of Patent: Nov. 15, 2011

(54) TRAY HANDLING APPARATUS AND SEMICONDUCTOR DEVICE INSPECTING METHOD USING THE SAME

(75) Inventors: Ssang-geun Im, Daejeon (KR);
Sang-yun Lee, Daejeon (KR);
Seung-gyu Ko, Daejeon (KR); Youn-soo Kim, Daejeon (KR)

(73) Assignee: Intekplus Co., Ltd., Daejeon (KR)

( * ) Notice: Subject to any disclaimer, the term of this patent is extended or adjusted under 35 U.S.C. 154(b) by 482 days.

(21) Appl. No.: 12/440,925

(22) PCT Filed: Sep. 12, 2007

(86) PCT No.: PCT/KR2007/004399
§ 371 (c)(1),
(2), (4) Date: Mar. 12, 2009

(87) PCT Pub. No.: WO2008/032983
PCT Pub. Date: Mar. 20, 2008

(65) Prior Publication Data
US 2010/0032262 A1 Feb. 11, 2010

(30) Foreign Application Priority Data

Sep. 13, 2006 (KR) .................. 10-2006-0088480

(51) Int. Cl.
*H01L 21/66* (2006.01)
*H01L 21/68* (2006.01)
*H01L 21/02* (2006.01)

(52) U.S. Cl. ........ 198/402; 198/375; 414/758; 414/773; 414/783

(58) Field of Classification Search ....... 198/375–377.1, 198/402–404; 414/758, 764, 767, 773, 782, 414/783, 936
See application file for complete search history.

(56) References Cited

U.S. PATENT DOCUMENTS

| | | | | | |
|---|---|---|---|---|---|
| 4,232,777 | A | * | 11/1980 | Smith et al. | 198/404 |
| 4,344,727 | A | * | 8/1982 | Chaloupka | 414/789.1 |
| 5,033,929 | A | * | 7/1991 | Marti | 414/403 |
| 5,588,796 | A | * | 12/1996 | Ricco et al. | 414/741 |
| 5,888,043 | A | * | 3/1999 | Jatcko | 414/459 |
| 5,975,278 | A | * | 11/1999 | Ruth | 198/377.01 |
| 6,139,243 | A | * | 10/2000 | Jackson et al. | 414/405 |
| 6,398,008 | B1 | * | 6/2002 | Suga | 198/404 |
| 2009/0074555 | A1 | * | 3/2009 | Murray et al. | 414/758 |

FOREIGN PATENT DOCUMENTS

| | | |
|---|---|---|
| JP | 6 61275 | 3/1994 |
| JP | 2002 164361 | 6/2002 |
| JP | 20 0339601 | 1/2004 |
| KR | 10 2000 0067263 | 11/2000 |
| KR | 10 2006 0008844 | 1/2006 |
| KR | 10 2006 0087850 | 8/2006 |

* cited by examiner

*Primary Examiner* — Mark A Deuble
(74) *Attorney, Agent, or Firm* — Kile Park Goekjian Reed & McManus PLLC

(57) ABSTRACT

Disclosed is a tray handling apparatus in which the conveyance and inversion of a tray can be performed simultaneously to thereby achieve a rapid inspecting operation and a simplified apparatus configuration, and a semiconductor device inspecting method using the tray handling apparatus. The tray handling apparatus includes an inverting unit to turn the tray, in which objects are received, upside down, and a transfer device to convey the object receiving tray from one conveyor to another conveyor while being reciprocally moved above a body of the apparatus. The inverting unit is integrally provided at a lower end of the transfer device, to allow the conveyance and inversion of the tray to be performed simultaneously.

18 Claims, 11 Drawing Sheets

TRAY HANDLING APPARATUS AND SEMICONDUCTOR DEVICE INSPECTING METHOD USING THE SAME

BACKGROUND OF THE INVENTION

1. Field of the Invention

The present invention relates to a tray handling apparatus and a semiconductor device inspecting method using the same, and more particularly, to a tray handling apparatus wherein a transfer device, used to convey a tray from one conveyer to another conveyor, is integrally provided with a tray inverting unit used to turn the tray upside down, whereby the conveyance and inversion of the tray can be performed simultaneously and consequently, a rapid inspecting operation and a simplified configuration can be accomplished, and a semiconductor device inspecting method using the tray handling apparatus.

2. Description of the Related Art

An object, such as completely manufactured semiconductor devices or wafer pieces cut in the course of manufacture, is put into a tray, for an inspection, test, or other subsequent processes thereof. A handler, to handle the tray, has to transfer and invert the tray in which the object is received, and therefore, have a need for a transfer device and an inverting device.

Hereinafter, an operation for inspecting and sorting semiconductor devices using a handler will be described.

A semiconductor device, which is manufactured via a series of processes, essentially has to go through several precise inspections prior to shipping. Examples of these precise inspections include an external-appearance inspection using a vision-camera as well as an electric-operation inspection since even minute external-appearance defects of semiconductor devices as well as internal defects of a semiconductor device package have a serious effect on the performance of semiconductor devices.

Generally, external-appearance defects of semiconductor devices, and more particularly, defects of a ball grid array (BGA) and lead may occur in the course of assembling semiconductor devices with a printed circuit board (PCB), etc. Therefore, it can be said that an inspection of the lead or ball is very important.

A conventional technology, related to an inspection for external-appearance defects of semiconductor devices and to a rapid sorting of the semiconductor devices based on the inspection results, is disclosed in Korean registered Utility Model Publication No. 20-0339601.

However, the conventional technology, disclosed in the above Korean registered Utility Model Publication No. 20-0339601, is usable only to inspect defects of leads or balls located at a rear surface of a semiconductor device, and cannot inspect a marking recorded on an upper surface of the semiconductor device and the overall external-appearance of the semiconductor device. Therefore, to inspect the marking and the overall external-appearance of the semiconductor device, there is an inconvenience in that additional other inspections should be performed using various inspecting apparatuses.

Another conventional technology to solve the above described problems is disclosed in Korean Patent Laid-open Publication No. 2006-0087850, which was filed by the applicant of the present invention and entitled "Semiconductor Device Inspecting Apparatus".

The disclosed conventional semiconductor device inspecting apparatus, as shown in FIG. 11, comprises: a body 100; a loading device 210 to load, thereon, a tray, in which semiconductor devices to be inspected are received; an inspecting device 300 to inspect the semiconductor devices; a buffer 220 to temporarily store a buffer tray, in which completely-inspected semiconductor devices are received; a first rejecting device 230, a second rejecting device 240, and a third rejecting device 250, which are used to load different trays thereon, respectively, the loaded trays receiving defective semiconductor devices sorted according to the kind of defects on the basis of inspection results; and an unloading device 260 to unload a tray, in which normal semiconductor devices sorted on the basis of the inspection results are received. The inspecting apparatus further comprises: a plurality of tray conveyers 480 connected, respectively, to the loading device 210, buffer 220, first to third rejecting devices 230, 240, and 250, and unloading device 260, the tray conveyors 480 allowing the tray to move in a forward and rearward direction of the body 100; a transfer device 500 installed above the body 100 to reciprocally move in a horizontal direction, the transfer device 500 allowing the tray to move between the tray conveyors 480 of the loading device 210, buffer 220, first to third rejecting devices 230, 240, and 250, and unloading device 260; and a sorting device 600 installed to reciprocally move between the tray conveyers 480 of the buffer 220, first to third rejecting devices 230, 240, and 250, and unloading device 260, the sorting device 600 being used to pick up defective semiconductor devices, received in the tray being transferred onto the unloading device 260, so as to convey the defective semiconductor devices to any one of the first to third rejecting devices 230, 240, and 250 on the basis of the kind of defects and also, being used to pick up normal semiconductor devices received in the buffer tray so as to fill normal products in an empty blank of the unloading device 260 remained after discharging the defective semiconductor devices.

Specifically, the inspecting device 300 includes first and second vision-cameras 310 and 320 to perform a vision inspection. The first vision-camera 310 is used to inspect one surface of the semiconductor devices received in the tray loaded on the loading device 210, and the second vision-camera 310 is used to inspect the other surface of the semiconductor devices. To allow both the surfaces of the semiconductor devices to be sequentially inspected by use of the first and second vision cameras 310 and 320, the conventional inspecting apparatus further comprises an inverting device 700 to turn the tray, in which the semiconductor devices are received, upside down.

In FIG. 11, reference numeral 420 represents an empty tray, reference numeral 410 represents a loading stacker, reference numeral 470 represents a feeder on which the empty tray is disposed, reference numerals 430, 440, 450, and 460 represent feeders to be put on the first, second, and third rejecting devices 230, 240, and 250 and the unloading device 260, and reference numeral 610 represents a sorter to sort the semiconductor devices.

With the above described configuration, if the semiconductor devices, which were supplied by the loading device 210 and received in the tray, are transferred by the tray conveyors 480, one surface of the semiconductor devices is inspected by the first vision-camera 310. The semiconductor devices, having the completely inspected one surface, are turned upside down by the inverting device 700.

Here, the inverting device 700 should have an empty tray, to allow the semiconductor devices to be again received in the tray while showing the other surface thereof by being turned upside down within the tray.

The inverted tray is conveyed to the tray conveyor within an inspection region of the second vision-camera 320 by the transfer device 500 used to reciprocally convey the tray between the tray conveyors. Thereby, semiconductor devices received in the conveyed tray after being inverted are inspected by the second vision-camera 320.

In the conventional semiconductor device inspecting apparatus, as described above, the inverting device 700 should be provided between the first vision-camera 310 and the second vision-camera 320, in order to turn the tray, in which the semiconductor devices, having one surface inspected by the first vision-camera 310, are received, upside down. Also, the transfer device 500 should be provided to convey the inverted tray to an inspection region of the second vision-camera 320.

Due to the fact that the inverting device 700 and the transfer device 500 to invert and convey the tray are provided separately from each other, the conventional inspecting apparatus has a complicated configuration. Further, since the tray is transferred reciprocally after being completely inverted, the inversion and conveyance of the tray cannot be performed simultaneously. This makes it impossible for the inspecting apparatus to perform an inspection at a high speed.

When the tray is supplied from the loading device at a high speed, an inspection speed does not follow the tray supply speed. This causes the tray loading and sorting devices to be left in a ready state, resulting in a deterioration in inspection and sorting efficiencies.

SUMMARY OF THE INVENTION

Therefore, the present invention has been made in view of the above problems, and it is an object of the present invention to provide a tray handling apparatus, in which a transfer device, used to convey a tray from one conveyor to another conveyer by reciprocal movements thereof, is integrally provided with a tray inverting unit used to turn the tray upside down, whereby the both-surface inversion and conveyance of the tray can be performed by a single module, and a semiconductor device inspecting method using the tray handling apparatus.

In accordance with an aspect of the present invention, the above and other objects can be accomplished by the provision of a tray handling apparatus to convey and invert a tray comprising: an inverting unit to turn the tray, in which objects are received, upside down; and a transfer device to pick up the object receiving tray and convey the tray from one conveyor to another conveyor while being reciprocally moved above a body of the apparatus, wherein the inverting unit is integrally provided at a lower end of the transfer device.

The transfer device may comprise: an empty tray corresponding to the object receiving tray; and a tray loading unit on which the object receiving tray and the empty tray are seated, and the inverting unit may be provided at one side or either side of the tray loading unit, and is operated to rotate the tray loading unit so as to allow the objects, received in the tray, to be again received in the empty tray such that both surfaces of the objects are turned over.

The transfer device may further comprise: a tray pickup unit to pick up the object receiving tray, so as to load the tray on the tray loading unit; and a first lifter to move the tray pickup unit upward and downward. The tray loading unit may comprise: a main body; a pair of front and rear upper sliding covers provided at an upper end of the main body and used to load the empty tray; a pair of front and rear lower sliding covers provided at a lower end of the main body and used to load the object receiving tray; and fixing elements installed to move forward and rearward within a range of the main body, so as to fix the empty tray and the object receiving tray.

In accordance with another aspect of the present invention, the above and other objects can be accomplished by the provision of a semiconductor device inspecting method using a tray handling apparatus to separate completely-inspected semiconductor devices into normal products and defective products on the basis of inspection results, the tray handling apparatus comprising a transfer device to convey an object receiving tray from one conveyor to another conveyor by being reciprocally moved above a body of the apparatus, the transfer device including: a tray pickup unit; a tray loading unit having an empty tray, lower sliding covers to load the object receiving tray, upper sliding covers to load the empty tray, and fixing elements to fix the object receiving tray and the empty tray; and an inverting unit to rotate the tray loading unit, the method comprising: conveying the object receiving tray to a rear end of the body; picking up the object receiving tray, conveyed to the rear end of the body, by use of the transfer device, and coupling the object receiving tray with the empty tray provided on the tray loading unit; and rotating the tray loading unit while conveying the transfer device to a following conveyor, to allow semiconductor devices, received in the object receiving tray, to be again received in the empty tray such that both surfaces of the semiconductor devices are turned over.

The picking up and coupling of the tray may comprise: moving the tray pick up unit downward; picking up the object receiving tray; moving the picked tray upward, to load the tray on the lower sliding covers; and clamping the lower sliding covers. Alternatively, the picking up and coupling of the tray may comprise: moving the tray pick up unit and the tray loading unit downward simultaneously, to reduce a distance between the tray and the tray loading unit at a high speed; picking up the object receiving tray by use of the tray pickup unit; moving the picked tray upward, to load the tray on the lower sliding covers; and clamping the lower sliding covers.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Now, preferred embodiments of the present invention will be described in detail with reference to the accompanying drawings, to allow those skilled in the art to easily understand and reproduce the present invention.

In a tray handling apparatus of the present invention, an inverting unit 7 used to turn a tray, in which objects are received, upside down, is integrated with a transfer device 5, which is used to pick up and convey the tray as it reciprocally moves above a body of the apparatus, to allow the conveyance and inversion of the tray to be performed simultaneously. In a characteristic aspect of the present invention, the inverting unit 7 is integrally provided at a lower end of the transfer device 5.

The tray handling apparatus is used to handle a tray in which objects, such as completely manufactured semiconductor devices or wafer pieces cut in the course of manufacture, are received for the purpose of an inspection, test, or other subsequent processes. Hereinafter, an embodiment related to an apparatus of inspecting completely manufactured semiconductor devices will be described.

Figure 1:
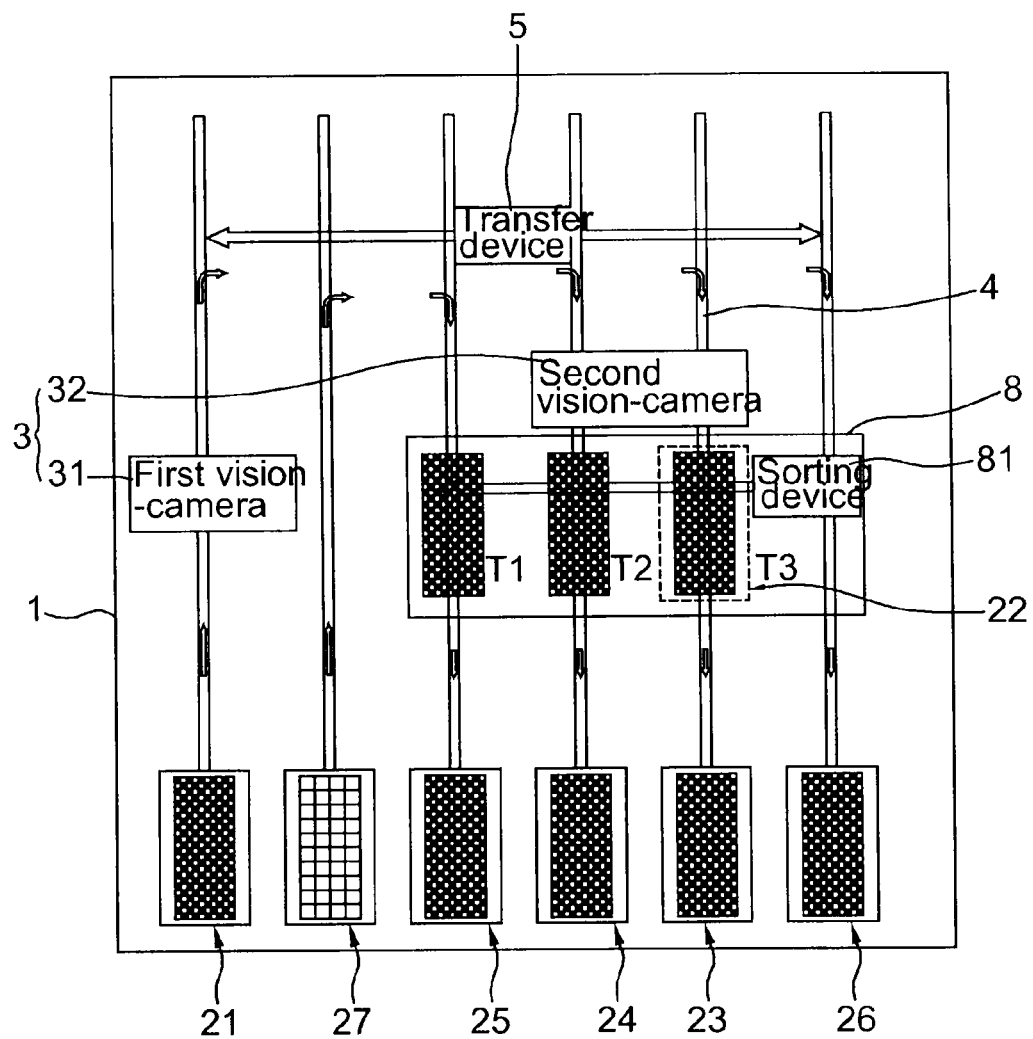
FIG. 1 is a configuration view illustrating an embodiment of a tray handling apparatus according to the present invention.
Figure 2:
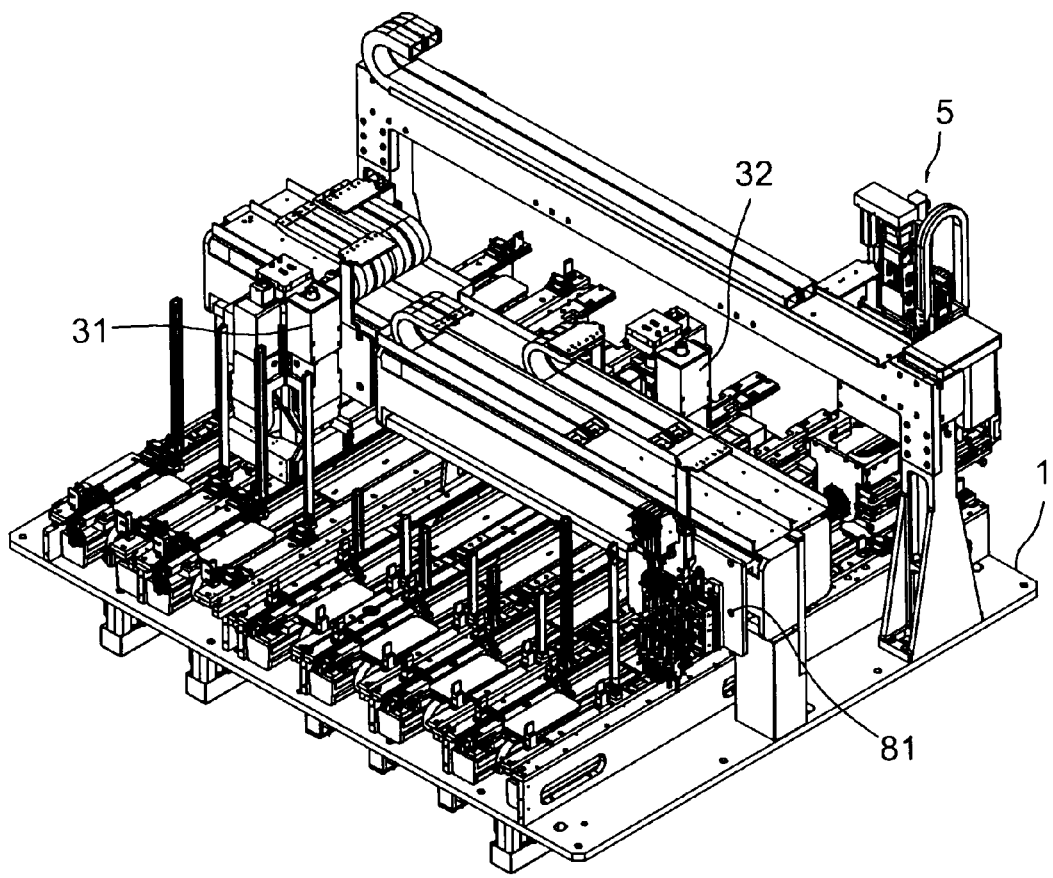
FIG. 2 is an upper perspective view illustrating the front side of the tray handling apparatus shown in FIG. 1.

FIG. 1 is a configuration view illustrating an embodiment of a tray handling apparatus according to the present invention. FIG. 2 is an upper perspective view illustrating the front side of the tray handling apparatus shown in FIG. 1. The tray handling apparatus of the present invention comprises a body 1, a loading device 21, an inspecting device 3, a buffer 22, first to third rejecting devices 23, 24, and 25, an unloading device 26, conveyors 4, a transfer device 5, and a sorting device 8. In the following description, roles and operations of the above respective components are known, and a detailed description thereof will be omitted.

The loading device 21 is used to load thereon a tray, in which semiconductor devices to be inspected are received. The inspecting device 3 is used to inspect the semiconductor devices, and includes a first vision-camera 31 and a second vision-camera 32.

The buffer 22 is used to temporarily store a buffer tray, in which completely-inspected semiconductor devices are received. The first to third rejecting devices 23, 24, and 25 are used to load thereon trays, in which defective semiconductor devices are sorted and received according to the kind of defects on the basis of inspection results. The unloading device 26 is used to load thereon a tray, in which normal semiconductor devices sorted on the basis of the inspection results are received.

The conveyors 4 are connected to the loading device 21, buffer 22, first to third rejecting devices 23, 24, and 25, and unloading device 26, respectively. The tray can be moved in a forward and rearward direction of the body 1 by the conveyors 4.

The transfer device 5 is installed above the body 1, to reciprocally move in a horizontal direction. The transfer device 5 is used to convey the tray between the tray conveyors 4 of the loading device 21, buffer 22, first to third rejecting devices 23, 24, and 25, and unloading device 26. In accordance with a characteristic aspect of the present invention, the transfer device 5 is integrally provided, at a lower end thereof, with an inverting unit 7 used to turn the tray upside down.

The sorting device 8 includes a sorting module 81 to separate the semiconductor devices, received in the buffer tray 22, into normal semiconductor devices and defective semiconductor devices to be sorted into the trays on the first to third rejecting devices 23, 24, and 25, and the unloading device 26.

Figure 3:
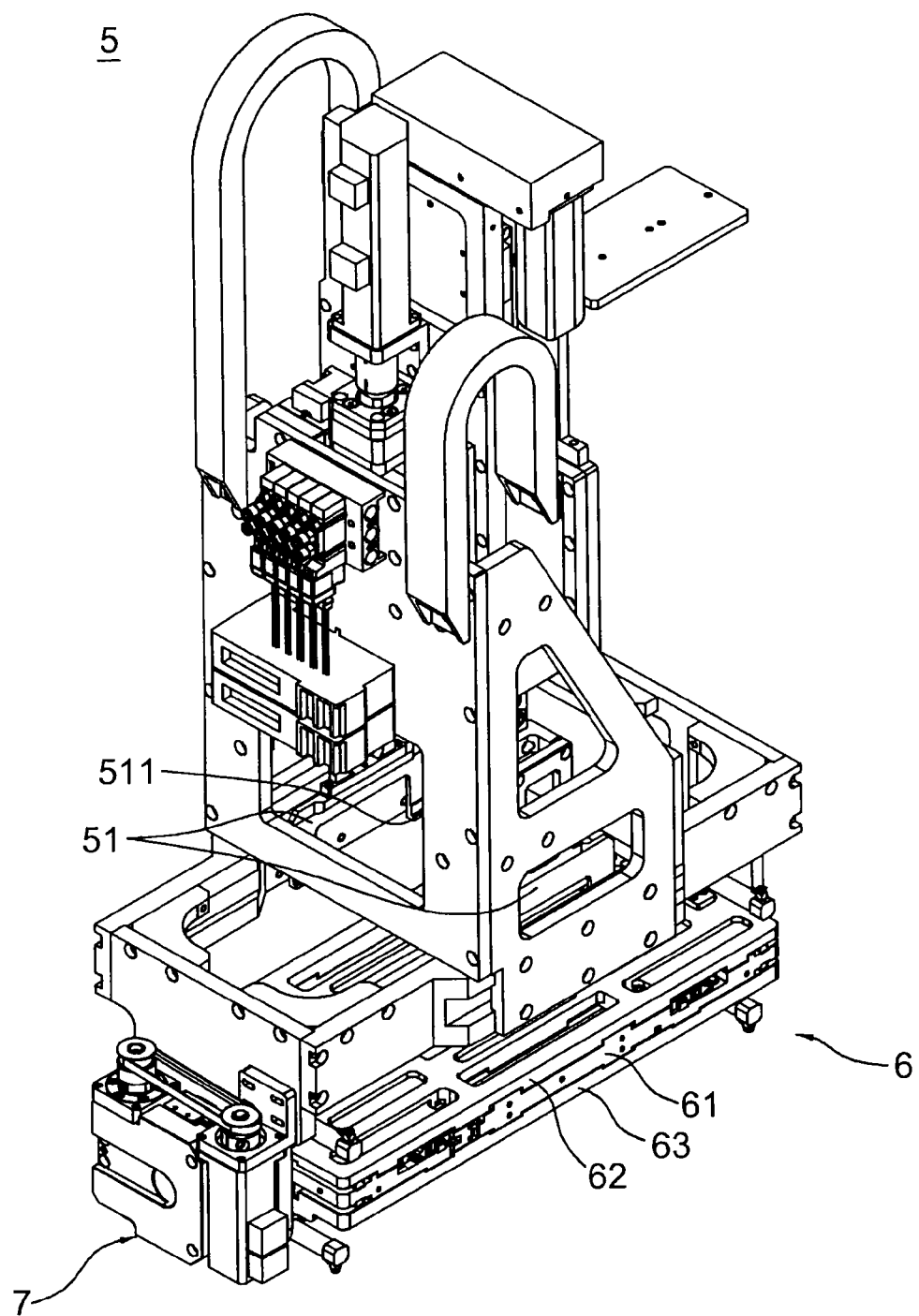
FIG. 3 is an enlarged perspective view of a transfer device shown in FIG. 2.

FIG. 3 is an enlarged perspective view of the transfer device shown in FIG. 2. The transfer device 5 includes a tray loading unit 6, the inverting unit 7, and a tray pickup unit 51. Once objects, i.e. the semiconductor devices received in a tray (hereinafter, the tray, in which the semiconductor devices are received, is designated as reference numeral 92), are subjected to a primary vision-inspection using the first vision-camera 31, the transfer device 5 turns the tray 92 upside down while simultaneously conveying the tray 92 to a subsequent inspection region. With this operation, an inspecting operation can be more rapidly accomplished as compared to a conventional inspection apparatus in which an inverting device and a transfer device are provided separately from each other.

Figure 4:
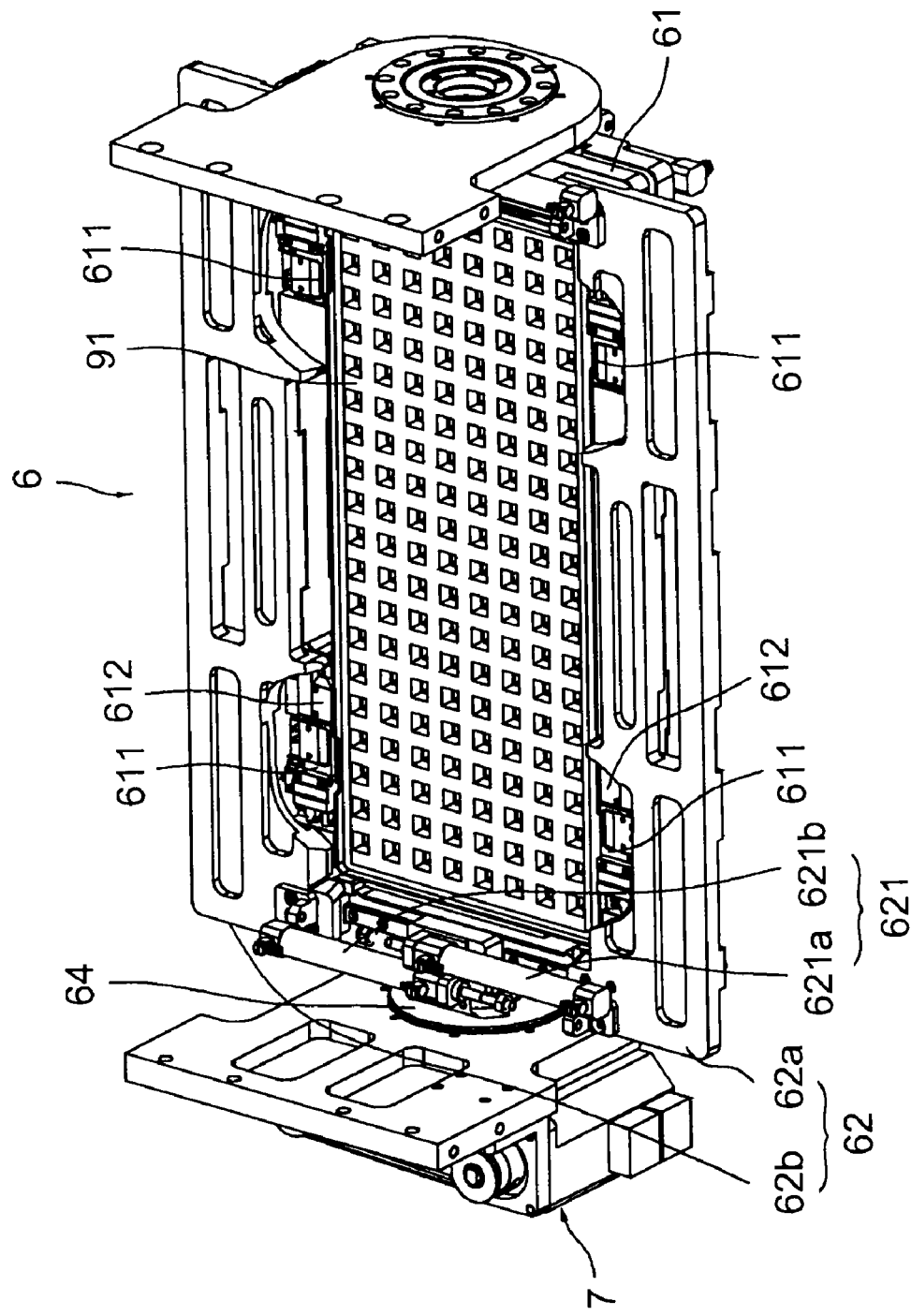
FIGS. 4 to 6 are enlarged perspective views illustrating a tray loading unit shown in FIG. 3.
Figure 5:
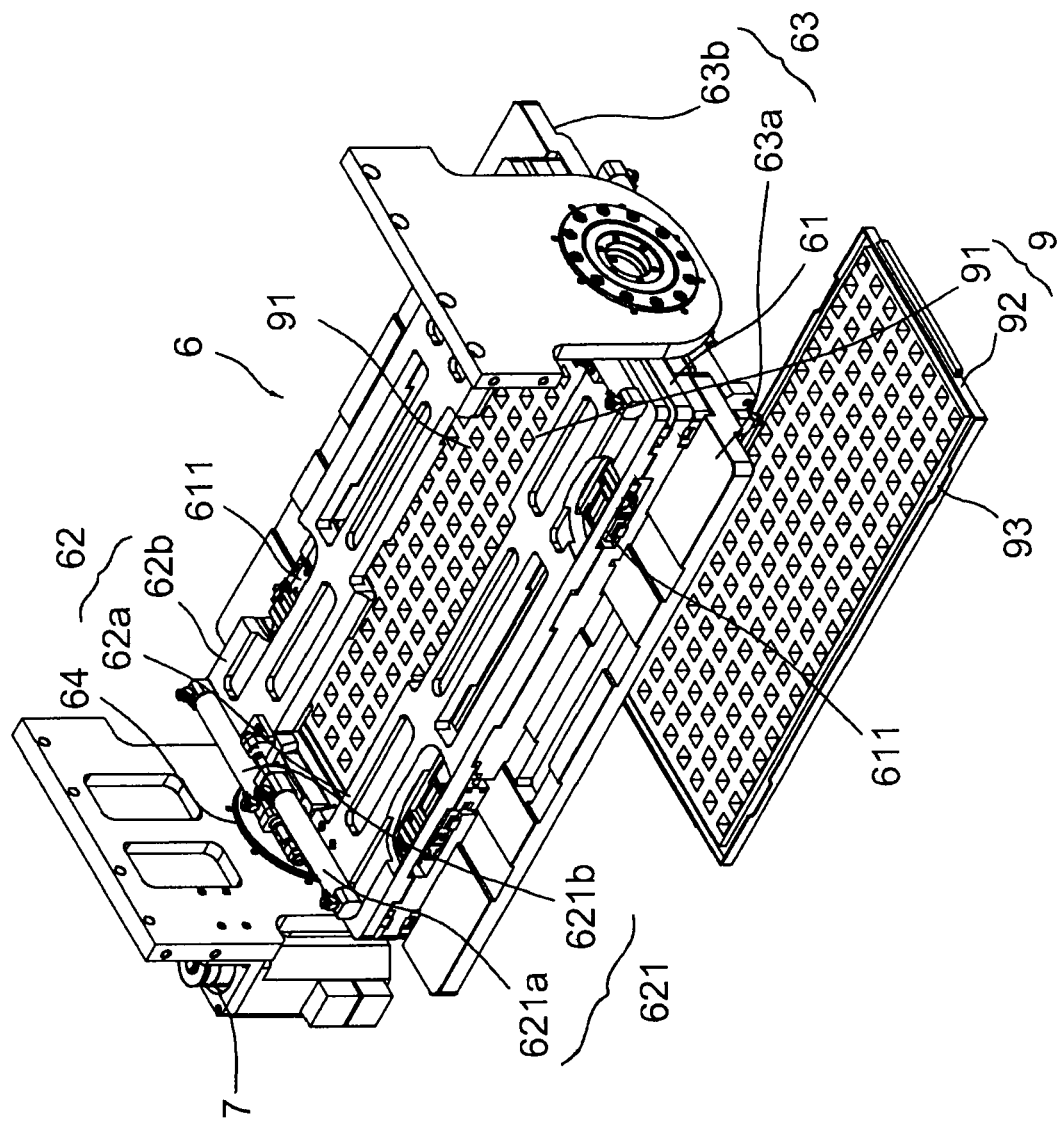
Figure 6:
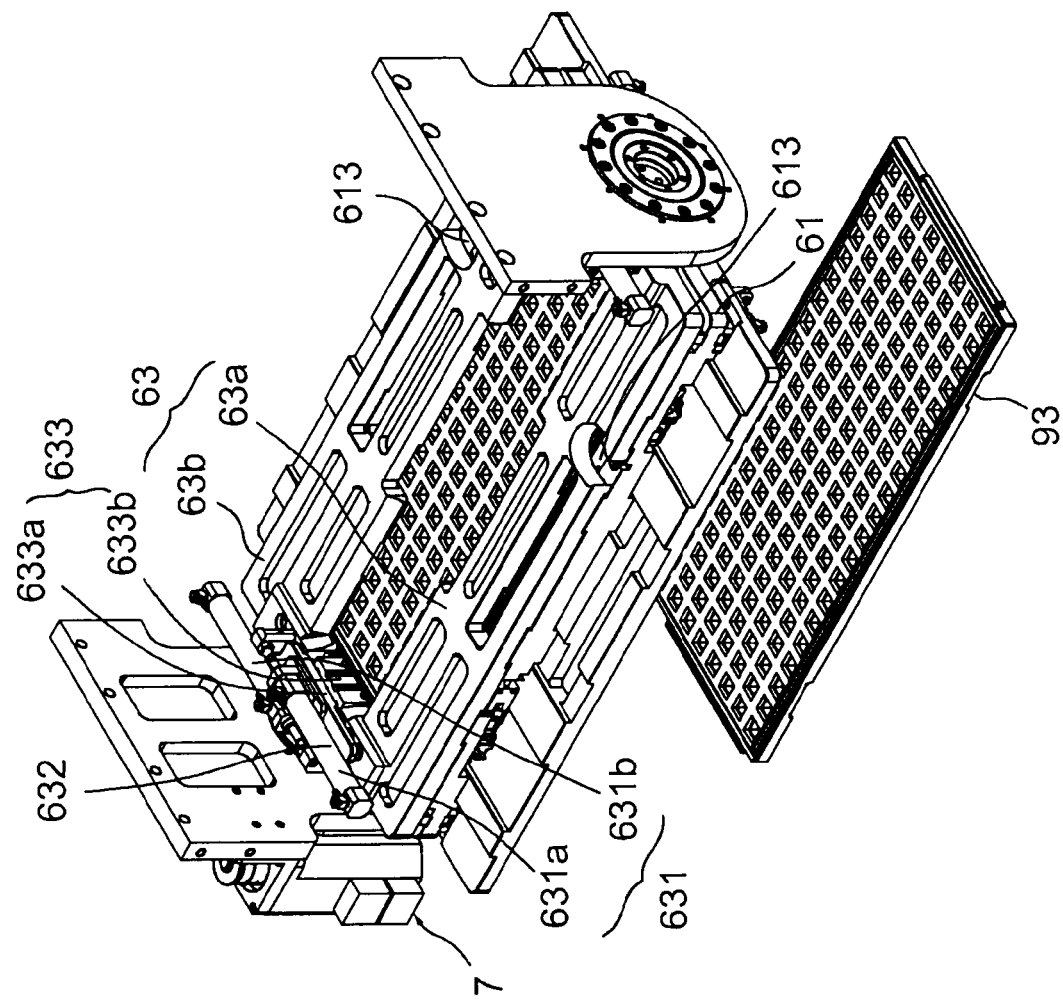

FIGS. 4 to 6 are enlarged perspective views illustrating the tray loading unit of FIG. 3. Specifically, FIG. 4 illustrates a state wherein only an empty tray 91 is loaded, FIG. 5 illustrates a state wherein a lower sliding cover 63, which will be described hereinafter, is opened to load the tray 92 after loading the empty tray 91, and FIG. 6 illustrates a state wherein the lower sliding cover 63 is opened after turning the tray 92 upside down.

Referring to the drawings, the tray loading unit 6 is provided with the empty tray 91 corresponding to the tray 92.

The tray loading unit 6 includes a main body 61, upper sliding covers 62, lower sliding covers 63, and fixing elements 611. The tray loading unit 6 further includes a pair of rotating shafts 64 provided at both ends thereof, to allow the tray loading unit 6 to rotate about the rotating shafts 64.

The main body 61 is provided, at an upper end surface thereof, with empty tray sensors 612 to sense whether or not the empty tray 91 is loaded, and, at a lower end surface thereof, with tray sensors 613 to sense whether or not the tray 92 is loaded.

The upper sliding covers 62 include a pair of front and rear sliding covers provided at an upper end of the main body 61. The upper sliding covers 62 are used to load the empty tray 91 on the main body 61. If the empty tray 91 is picked up by the pickup unit 51 and is loaded on the main body 61, the upper sliding covers 62 are moved forward and rearward by drive cylinders 621; 621*a* and 621*b* to cover the empty tray 91 such that the empty tray 91 can be seated on and stably come into close contact with the main body 61.

The lower sliding covers 63 include a pair of front and rear sliding covers provided at a lower end of the main body 61. The lower sliding covers 63 are used to load the tray 92 on the main body 61. If the tray 92 is picked up by the pickup unit 51 and is loaded on the main body 61, the lower sliding covers 63 are moved forward and rearward by drive cylinders 631; 631*a* and 631*b*, to stably seat and load the tray 92 on the main body 61.

In this case, the lower sliding covers 63 may further include tension springs 632 to apply a vertical tensile force to both the empty tray 91 and the tray 92, so as to prevent the two trays from being bent when the trays coupled with each other are turned upside down by the inverting unit 7, or so as to prevent the semiconductor devices received in the tray from being moved and lifted due to a gap caused between the trays stacked one above another.

The tray loading unit 6 further includes a clamping mechanism 633 to press the lower sliding covers 63 toward the upper sliding covers 62 by pre-loading, so as to allow the empty tray 91 and the tray 92 to come into close contact with each other.

The clamping mechanism 633 includes a clamping plate 633*a* to come into close contact with the lower sliding covers 63, and a clamping cylinder 633*b* to apply a pre-load to the clamping plate 633*a*.

The upper sliding covers 62 and the lower sliding covers 63 have inclined inner portions, respectively, and the inclined inner portions are oriented to face the main body 61.

With the present invention, as described above, the upper sliding covers 62 and the lower sliding covers 63 are movable forward and rearward by the respective drive cylinders 621 and 631. Accordingly, when the size of a tray to be inspected is changed, positions of the upper and lower sliding covers 62 and 63 can be appropriately adjusted to conform to the changed size of the tray by controlling forward and rearward movements of the upper and lower sliding covers 62 and 63 by means of the drive cylinders 621 and 631. In this way, the conveyance and inversion of various kinds of trays are possible.

The fixing elements 611 are used to couple the empty tray 91 and the tray 92 with each other when the trays 91 and 92 are loaded on the main body 61 by the upper and lower sliding covers 62 and 63. The fixing elements 611 include four stack fingers, which are movable forward and rearward within a range of the main body 61.

Conventionally, a tray has a plurality of holes 93 perforated horizontally through side surfaces of the tray. Accordingly, if the plurality of fixing elements 611 are advanced into the holes 93 of the empty tray 91 after the empty tray 91, which was primarily loaded by the pickup unit 51, is again picked up, the empty tray 91 is kept in a stacked state.

If the empty tray sensors 612, provided at the upper end surface of the main body 61, sense the loading of the empty tray 91 after completing the stacking of the empty tray 91, the tray 92 is picked up by the pickup unit 51, and the drive cylinders 631 are driven to open the lower sliding covers 63, for the loading of the tray 92.

Here, although the tray 92 receives the semiconductor devices having passed through the primary vision-inspection, the illustration of semiconductor devices is omitted in the drawing for the sake of illustration convenience.

After the lower sliding covers 63 are opened and the tray 92 is loaded underneath the main body 61, if the tray sensors 613, provided at the lower end surface of the main body 61, sense the loading of the tray 92, the lower sliding covers 63 are closed by the drive cylinders 631. Then, a pre-load is applied to the lower sliding covers 63 by use of the clamping mechanism 633, to press the lower sliding covers 63 toward the upper sliding covers 62, thereby allowing the tray 92 and the empty tray 91 to come into close contact with each other.

Although the fixing elements 611 are used to couple the tray 92 and the empty tray 91 with each other as described above, they may be also used to stack only the empty tray when it is desired to leave only the empty tray having no semiconductor devices therein after being turned upside down, and to separate the tray, in which the semiconductor devices are newly received. With this operation, easy separation of the tray can be accomplished.

Generally, in the course that the tray, in which the semiconductor devices are received, is conveyed at a high speed, the received semiconductor devices may be separated from the tray. Accordingly, when the tray is conveyed without being turned upside down, the empty tray 91 provided at the tray loading unit 6 may serve as a cover tray. In this case, with the provision of the empty tray sensors 612 to confirm whether or not the empty tray is loaded, the efficient maintenance of the above operation is possible.

The tray pickup unit 51 is used not only to pick up the tray 92 being conveyed after being subjected to the primary vision-inspection using the first vision camera 31 so as to load the tray 92 underneath the main body 61 of the tray loading unit 6, but also to load the tray, conveyed by the transfer device 5, to any one of the conveyors 4 in a subsequent process.

The tray pickup unit 51 is formed with finger-shaped holders 511, which are inserted into the holes 93 perforated through the side surfaces of the tray 92 to pick up the tray 92 from the bottom of the tray 92.

It will be appreciated that the size of the holes 93 and the interval between the holes 93 can be changed according to the kind of the tray 92. Therefore, if necessary, the tray pickup unit 51 can be replaced to conform to the kind of the tray. While the tray loading unit 6 is turned upside down, preferably, the tray pickup unit 51 is lifted so as not to interfere the turning of the tray.

Figure 7:
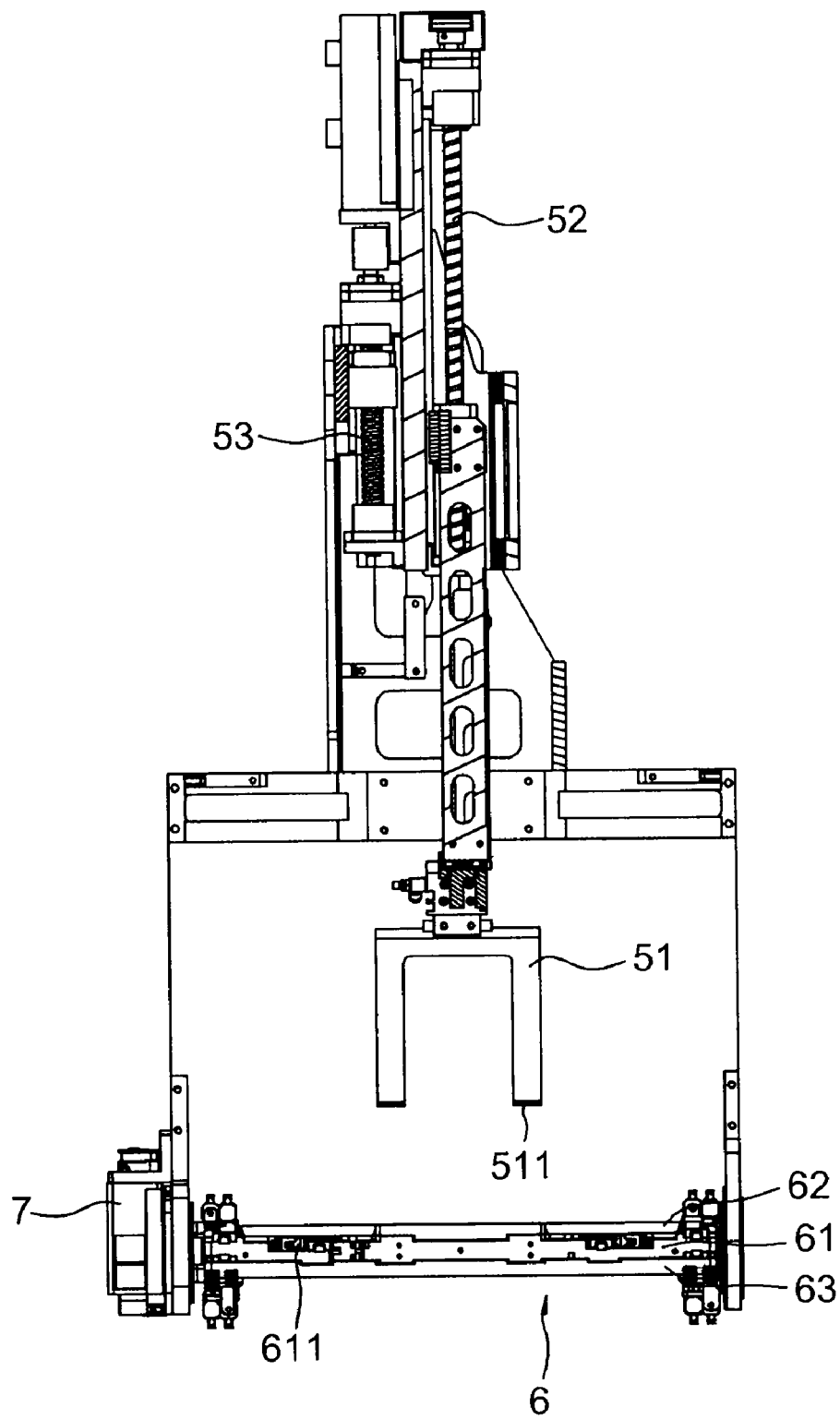
FIG. 7 is a side view of the transfer device shown in FIG. 3.

FIG. 7 is a side view of the transfer device shown in FIG. 3. The transfer device 5 includes a first lifter 52 to vertically move the tray pickup unit 51 in a Z-axis direction by controlling a drive device such as a motor.

The transfer device 5 further includes a second lifter 53 to vertically move the tray loading unit 6 in the Z-axis direction by controlling the drive device such as a motor, to achieve a rapid coupling of the tray 92 and the empty tray 91.

When the tray 92 is picked up by the tray pickup unit 51 driven by the first lifter 52 to thereby be loaded on the tray loading unit 6, the tray 92 transferred after completing the inspection of semiconductor devices is spaced apart from the tray loading unit 6 by a predetermined distance.

The distance between the tray loading unit 6 and the tray 92 can be reduced as the tray loading unit 6 is moved downward by the second lifter 53. This has the effect of reducing an operating distance of the tray pickup unit 51.

As a result, a time required to pick up and load the tray using the tray pickup unit 51 is reduced, and consequently, a rapid tray loading and improved inspection efficiency can be accomplished.

The tray handling apparatus of the present invention may further comprise an elevator (not shown) provided at a rear end of the body 1, to move up and down the tray 92 transferred after being inspected through the first vision-camera 31, so as to mount the tray 92 at the tray loading unit 6.

Meanwhile, the inverting unit 7 is provided at one side or either side of the tray loading unit 6. The inverting unit 7 is used to move the semiconductor devices received in the tray 92 into the empty tray 91 by rotating the tray loading unit 6, for the purpose of turning the semiconductor devices upside down.

For this, although not shown in the drawings, the inverting unit 7 may include a drive device such as a motor, to rotate the tray loading unit 6 at one side or either side of the tray loading unit 6.

Figure 8:
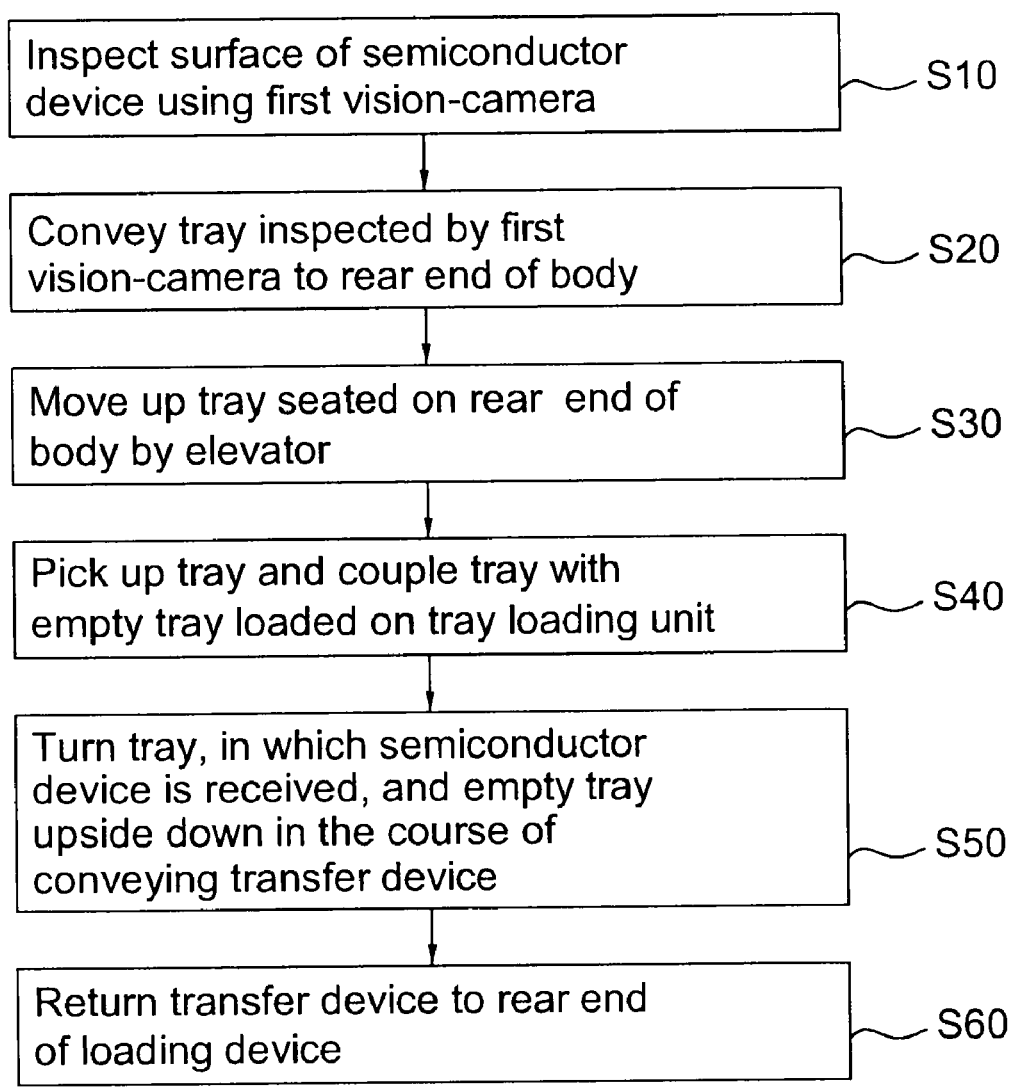
FIG. 8 is a flow chart illustrating a part of an inspecting method using the tray handling apparatus according to the present invention.

FIG. 8 is a flow chart illustrating a part of an inspecting method using the tray handling apparatus according to the present invention. Herein, a tray supply and vision inspecting method, and a sorting method based on inspection results are known, and a detailed description thereof will be omitted.

First, if a tray, in which semiconductor devices to be inspected are received, is supplied from the loading device 21, the first vision-camera 31 inspects one surface of the tray (S10).

Then, the tray (hereinafter, designated as reference numeral 92), having one surface inspected by the first vision-camera 31, is conveyed to the rear end of the body 1 by the conveyor (S20).

Subsequently, after the tray 92 is picked up by the tray pickup unit 51 under the control of operation of the first lifter 52, the tray 92 is coupled with the empty tray 91 which was previously loaded on the tray loading unit 6 (S40).

In this case, prior to the pickup of the tray 92 using the tray pickup unit 51, the method of the present invention may further comprise an operation (S30) of moving upward the tray 92, transferred to the rear end of the body 1, by use of the elevator (not shown) provided at the rear end of the body 1.

Figure 9:
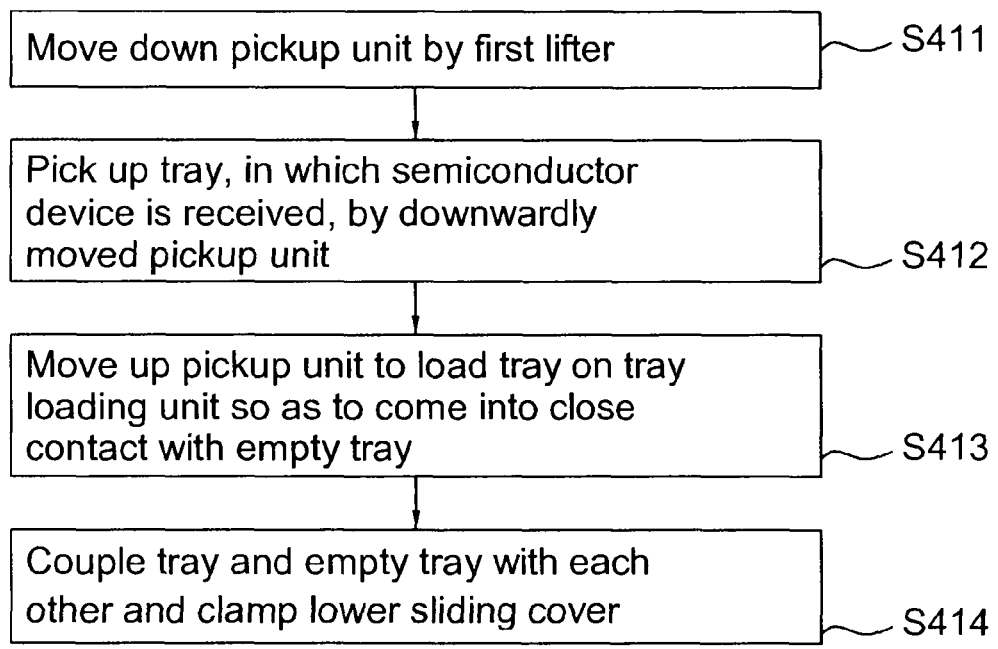
FIG. 9 is a flow chart illustrating an embodiment of a tray pickup and coupling operation of FIG. 8.

Here, the operation (S40) of picking up the tray 92 and coupling the tray 92 with the empty tray 91, as shown in FIG. 9, may comprise: an operation (S411) of moving downward the tray pickup unit 51 under the control of operation of the first lifter 52; an operation (S412) of picking up the tray 92 by the downwardly moved tray pickup unit 51; an operation (S413) of moving upward and downward the tray pickup unit 51 so as to load the tray 92 at the tray loading unit 6 such that the tray 92 comes into close contact with the empty tray 91; and an operation (S414) of coupling the empty tray 91 and the tray 92 with each other by clamping the lower sliding covers 63 to the upper sliding covers 62 by use of the clamping mechanism 633, so as to adjust the bending of the trays and to achieve the alignment of the semiconductor devices.

To allow the tray 92 and the empty tray 91 to come into close contact with each other, after the lower sliding covers 63 are opened by operation of the drive cylinders 631, the tray pickup unit 51 is moved upward and downward to seat the tray 92 on the main body 61. Thereafter, the lower sliding covers 63 are closed.

Figure 10:
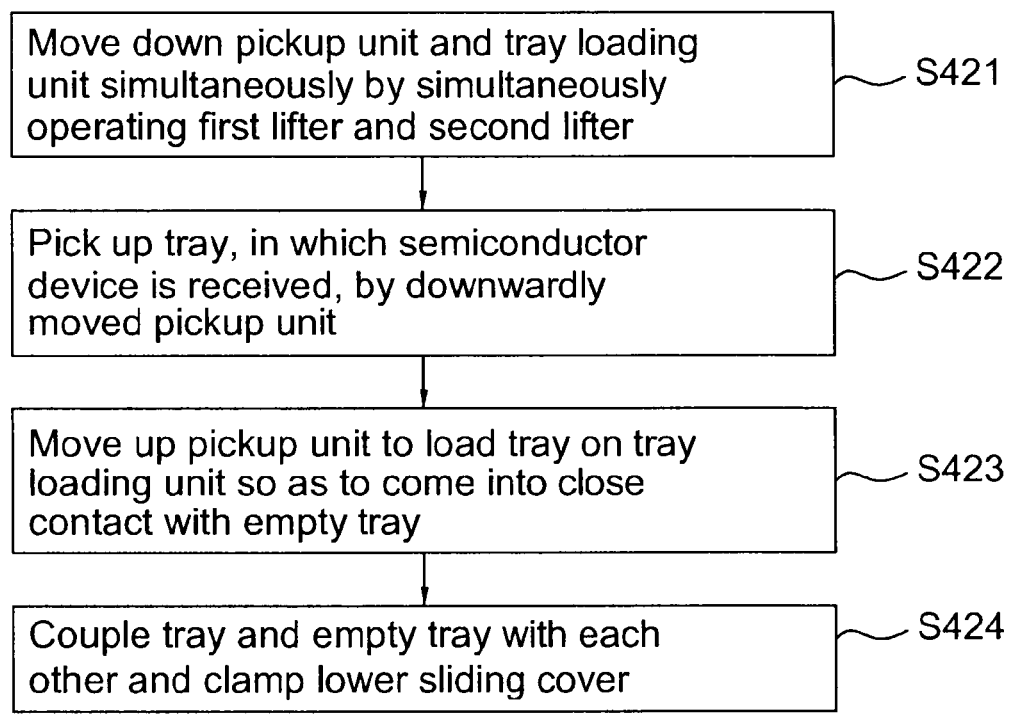
FIG. 10 is a flow chart illustrating another embodiment of the tray pickup and coupling operation of FIG. 8.
Figure 11:
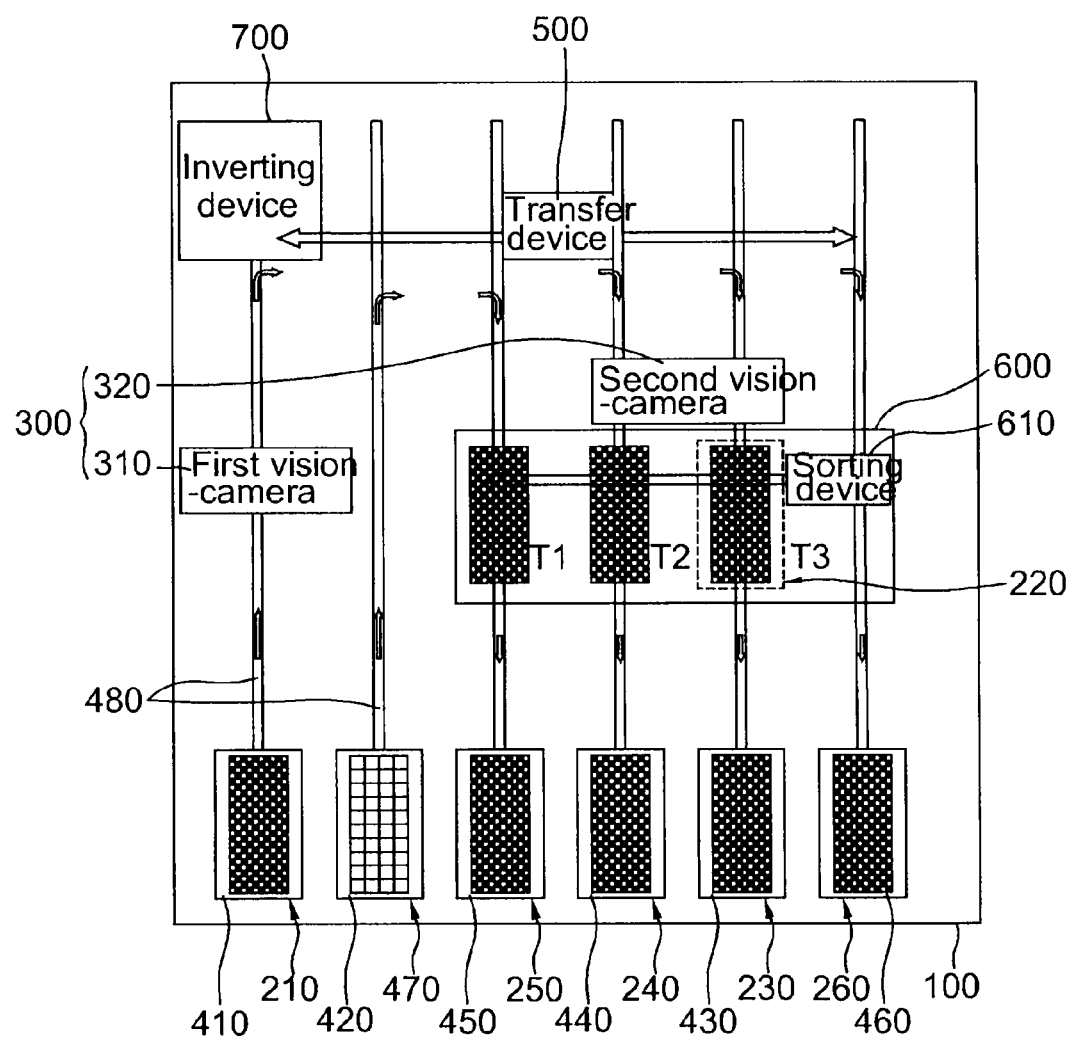
FIG. 11 is a configuration view illustrating a conventional tray handling apparatus.

Alternatively, the operation S40 of picking up the tray 92 and coupling the tray 92 with the empty tray 91, as shown in FIG. 10, may comprise: an operation (S421) of moving downward the tray pickup unit 51 and the tray loading unit 6 simultaneously by simultaneously operating the first lifter 52 and the second lifter 53, so as to reduce a distance between the tray 92 and the tray receiving unit 51 at a high speed; an operation (S422) of picking up the tray 92 by use of the downwardly moved tray pickup unit 51; an operation (S423) of moving upward the picked tray 92 to load the tray 92 at the tray loading unit 6 such that the tray 92 and the empty tray 91 come into close contact with each other; and an operation (S414) of coupling the tray 92 and the empty tray 91 with each other by clamping the lower sliding covers 63 to the upper sliding covers 62 by use of the clamping mechanism 633, so as to adjust the bending of the trays and to achieve the alignment of the semiconductor devices.

Meanwhile, after the coupling of the empty tray 91 and the tray 92, to enable an inspection using the second vision-camera 32, the inverting unit 7 is operated while the transfer device 5 is moved to a following conveyor. Thereby, the tray loading unit 6 is rotated by the inverting unit 7, thereby allowing the semiconductor devices to be turned upside down (S50).

As the tray loading unit 6 is rotated, the semiconductor devices received in the tray 92 are again received into the empty tray 91 such that their both surfaces are turned over. Accordingly, the tray 92 is changed into an empty tray. The resulting empty tray can be used as an empty tray to be inverted together with a following tray conveyed after being subjected to a following inspection using the first vision-camera 31.

Thereafter, the transfer device 5, moved to the following conveyor, loads the inverted tray in a following inspection region by use of the pickup unit, and then, is returned to a rear end of the loading device 21 in order to pick up and turn the following tray upside down (S60).

In this case, the empty tray, loaded by the lower sliding covers 63, is oriented such that a bottom surface thereof rather than an upper surface faces upward. Therefore, the empty tray has to be turned upside down, in order to allow the empty tray to be inverted and conveyed together with the following tray coupled thereto, or to allow the empty tray to be used as a cover tray for the following tray having no need to be inverted.

For this, the tray loading unit 6, on which the empty tray 6 is loaded such that the bottom surface thereof faces upward, has to be inverted. Thereby, the tray is loaded on the lower sliding covers 63 such that the upper surface thereof faces upward. Then, the tray is loaded on the upper sliding covers 62 by use of the pickup unit 51.

With the inspecting method using the tray handling apparatus according to the present invention, a tray, having a surface inspected by the first vision-camera, is picked up, and is inverted to be turned upside down in the course of being conveyed to a following inspection region. As compared to the previously described conventional inspecting method in which an inverting device and a transfer device are provided separately from each other such that a tray is inverted and conveyed sequentially, the method of the present invention has the effect of reducing an inspecting time.

As apparent from the above description, the present invention provides a tray handling apparatus, wherein a transfer device, used to convey a tray, in which semiconductor devices to be inspected are received, from one conveyor to another conveyor by reciprocal movements thereof, is integrally provided with an inverting unit, which is used to turn the tray upside down by rotation thereof, so as to enable both surfaces of the semiconductor devices to be inspected sequentially. Thereby, once being inspected at a surface thereof, the tray can be inverted in the course of being conveyed, and the inversion and conveyance of the tray can be performed by use of a single module. As a result, the present invention has the effects of reducing a time required to invert and convey the tray.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A tray handling apparatus to convey and invert a tray comprising: an inverting unit to turn the tray, in which objects are received, upside down; and a transfer device to pick up the object receiving tray and convey the tray from one conveyor to another conveyor while being reciprocally moved above a body of the apparatus,
    wherein the inverting unit is integrally provided at a lower end of the transfer device.

2. The apparatus according to claim 1, wherein:
    the transfer device comprises: an empty tray corresponding to the object receiving tray; and a tray loading unit on which the object receiving tray and the empty tray are seated; and
    the inverting unit is provided at one side or either side of the tray loading unit, and is operated to rotate the tray loading unit so as to allow the objects, received in the tray, to be again received in the empty tray such that both surfaces of the objects are turned over.

3. The apparatus according to claim 2, wherein the transfer device further comprises:
    a tray pickup unit to pick up the object receiving tray, so as to load the tray on the tray loading unit; and
    a first lifter to move the tray pickup unit upward and downward.

4. The apparatus according to claim 3, wherein the tray loading unit comprises:
    a main body;
    a pair of front and rear upper sliding covers provided at an upper end of the main body and used to load the empty tray;
    a pair of front and rear lower sliding covers provided at a lower end of the main body and used to load the object receiving tray; and
    fixing elements installed to move forward and rearward within a range of the main body, so as to fix the empty tray and the object receiving tray.

5. The apparatus according to claim 4, wherein the tray loading unit further comprises:
   an empty tray sensor provided at an upper end surface of the main body, to sense whether or not the empty tray is loaded; and
   a tray sensor provided at a lower end surface of the main body, to sense whether or not the object receiving tray is loaded.

6. The apparatus according to claim 4, wherein the tray loading unit further comprises:
   a clamping mechanism to clamp the lower sliding covers.

7. The apparatus according to any one of claims 2, wherein the transfer device further comprises:
   a second lifter to move the tray loading unit upward and downward, so as to allow the empty tray and the object receiving tray to be rapidly coupled with each other.

8. The apparatus according to any one of claims 3, wherein the transfer device further comprises:
   a second lifter to move the tray loading unit upward and downward, so as to allow the empty tray and the object receiving tray to be rapidly coupled with each other.

9. The apparatus according to any one of claims 4, wherein the transfer device further comprises:
   a second lifter to move the tray loading unit upward and downward, so as to allow the empty tray and the object receiving tray to be rapidly coupled with each other.

10. The apparatus according to any one of claims 5, wherein the transfer device further comprises:
    a second lifter to move the tray loading unit upward and downward, so as to allow the empty tray and the object receiving tray to be rapidly coupled with each other.

11. The apparatus according to any one of claims 6, wherein the transfer device further comprises:
    a second lifter to move the tray loading unit upward and downward, so as to allow the empty tray and the object receiving tray to be rapidly coupled with each other.

12. The apparatus according to claim 5, further comprising:
    an elevator provided at a rear end of the body, to move the object receiving tray upward and downward, so as to load the object receiving tray on the tray loading unit.

13. A semiconductor device inspecting method using a tray handling apparatus to separate completely-inspected semiconductor devices into normal products and defective products on the basis of inspection results, the tray handling apparatus comprising a transfer device to convey an object receiving tray from one conveyor to another conveyor by being reciprocally moved above a body of the apparatus, the transfer device including: a tray pickup unit; a tray loading unit having an empty tray, lower sliding covers to load the object receiving tray, upper sliding covers to load the empty tray, and fixing elements to fix the object receiving tray and the empty tray; and an inverting unit to rotate the tray loading unit, the method comprising:
    conveying the object receiving tray to a rear end of the body;
    picking up the object receiving tray, conveyed to the rear end of the body, by use of the transfer device, and coupling the object receiving tray with the empty tray provided on the tray loading unit; and
    rotating the tray loading unit while conveying the transfer device to a following conveyor, to allow the semiconductor devices, received in the object receiving tray, to be again received in the empty tray such that both surfaces of the semiconductor devices are turned over.

14. The method according to claim 13, wherein the picking up and coupling of the tray comprises:
    moving the tray pick up unit downward;
    picking up the object receiving tray;
    moving the picked tray upward, to load the tray on the lower sliding covers; and
    clamping the lower sliding covers.

15. The method according to claim 13, wherein the picking up and coupling of the tray comprises:
    moving the tray pick up unit and the tray loading unit downward simultaneously, to reduce a distance between the tray and the tray loading unit at a high speed;
    picking up the object receiving tray by use of the tray pickup unit;
    moving the picked tray upward, to load the tray on the lower sliding covers; and
    clamping the lower sliding covers.

16. The method according to any one of claims 13, further comprising: prior to picking up the tray transferred to the rear end of the body,
    moving the tray upward by use of an elevator.

17. The method according to any one of claims 14, further comprising: prior to picking up the tray transferred to the rear end of the body,
    moving the tray upward by use of an elevator.

18. The method according to any one of claims 15, further comprising: prior to picking up the tray transferred to the rear end of the body,
    moving the tray upward by use of an elevator.

* * * * *